United States Patent [19]

Vasile

[11] Patent Number: 5,083,050
[45] Date of Patent: Jan. 21, 1992

[54] MODIFIED CASCODE MIXER CIRCUIT

[75] Inventor: Carmine F. Vasile, Medford, N.Y.

[73] Assignee: Grumman Aerospace Corporation, Bethpage, N.Y.

[21] Appl. No.: 620,035

[22] Filed: Nov. 30, 1990

[51] Int. Cl.⁵ .................. H03B 19/00; H03K 3/353
[52] U.S. Cl. .................. 307/529; 307/304; 307/219.1; 455/333
[58] Field of Search ........ 307/529, 304, 219.1; 455/333; 328/15, 158; 333/100, 218

[56] References Cited

U.S. PATENT DOCUMENTS

| | | | |
|---|---|---|---|
| 4,090,139 | 5/1978 | Hoover | 307/304 |
| 4,814,649 | 3/1989 | Young | 307/529 |
| 4,845,389 | 7/1989 | Pyndiah et al. | 307/529 |

Primary Examiner—Timothy P. Callahan
Attorney, Agent, or Firm—Pollock, VandeSande & Priddy

[57] ABSTRACT

In a conventional mixer circuit, in order to have high conversion gain, high input power is needed. For the mixer circuit of the present invention, by incorporating a modified cascode circuit whereby the input stage FET has a higher saturation current than the output stage FET, the same high conversion gain can be achieved. In addition, the present invention mixer circuit requires an input DC power that is considerably less than that needed for the conventional mixer circuit.

10 Claims, 3 Drawing Sheets $W_1 > W_2$
$Idss_{20} > Idss_{22}$

MODIFIED CASCODE MIXER CIRCUIT

FIELD OF THE INVENTION

The present invention relates to mixer circuits and more particularly to a mixer circuit which has as its mixer element a modified cascode circuit for effecting a high level mixer.

BRIEF DESCRIPTION OF THE PRIOR ART

Mixer circuits are well known. In essence, mixer circuits are used to mix two input signals to deliver an output signal having either the difference or the sum of the input signals. There have been continuous attempts to increase the conversion gain of mixer circuits. A high level mixer circuit is shown in FIG. 1, where the essential components for the mixer circuit have been encircled by dotted line 2. As shown, the prior art mixer circuit 2 has a high level mixer 4 having an input RF signal from a RF amplifier 6 and a local oscillator (LO) signal from a LO amplifier 8. The RF and the LO signals are mixed in mixer 14 and an IF signal is output via IF amplifier 10. To obtain the state of the art performance, such as a conversion gain of 19 dB for the output IF signal, approximately 8 watt of DC power is required to be fed to the FIG. 1 mixer circuit.

BRIEF DESCRIPTION OF THE PRESENT INVENTION

The inventor has found that the performance of a mixer circuit can be enhanced by replacing the mixer element in the mixer circuit with a cascode circuit having a modified dual FET configuration. This enhanced mixer circuit is able to thereby lower the amount of DC power required, and at the same time maintain the conversion gain of the signal at its output.

The modified cascode configuration has a common source input stage FET connected to a common gate output stage FET, with the input stage FET having a saturation current Idss greater than the saturation current of the output stage FET. Such difference in the saturation current level between the FETs can be effected, if the FETs are to be fabricated onto the same semiconductor substrate, by adjusting the widths between the respective drain and source regions of the FETs. With such a modified cascode mixer circuit, it was found that only 0.7 watt of DC power is required to obtain a conversion gain of approximately 20 db for the output IF signal.

The objective of the present invention is, therefore, to provide for a mixer circuit which can produce a state of the art response, and yet not require the same high power which is needed in the prior art mixer circuits.

BRIEF DESCRIPTION OF THE FIGURES

The above-mentioned objective and advantages of the present invention will become more apparent and the invention itself will best be understood by reference to the following description of an embodiment of the invention taken in conjunction with the accompanying drawings, wherein.

DETAILED DESCRIPTION OF THE PRESENT INVENTION

Figure 1:
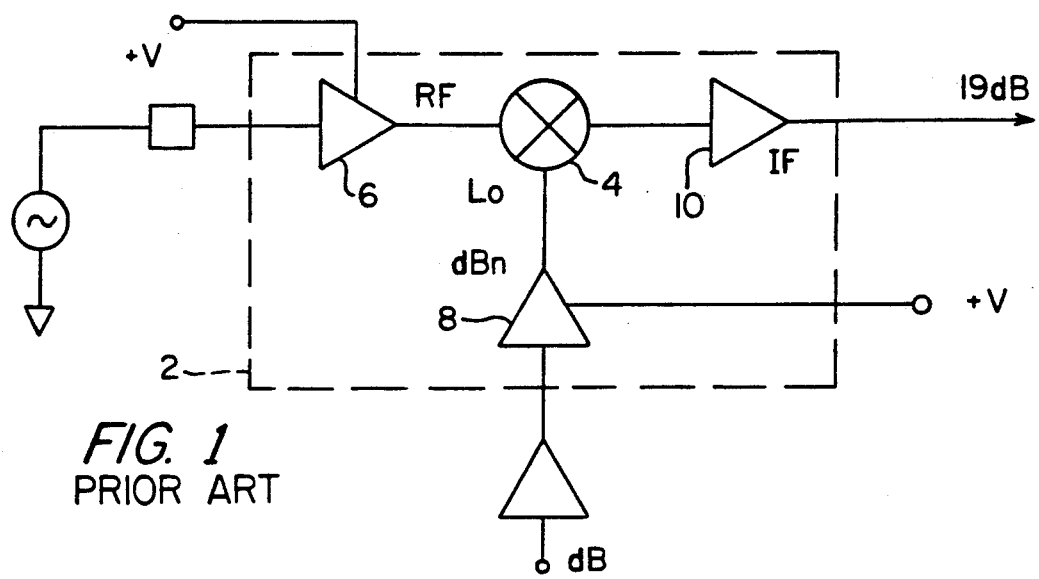
FIG. 1 is a schematic of a prior art high level mixer circuit.
Figure 2:
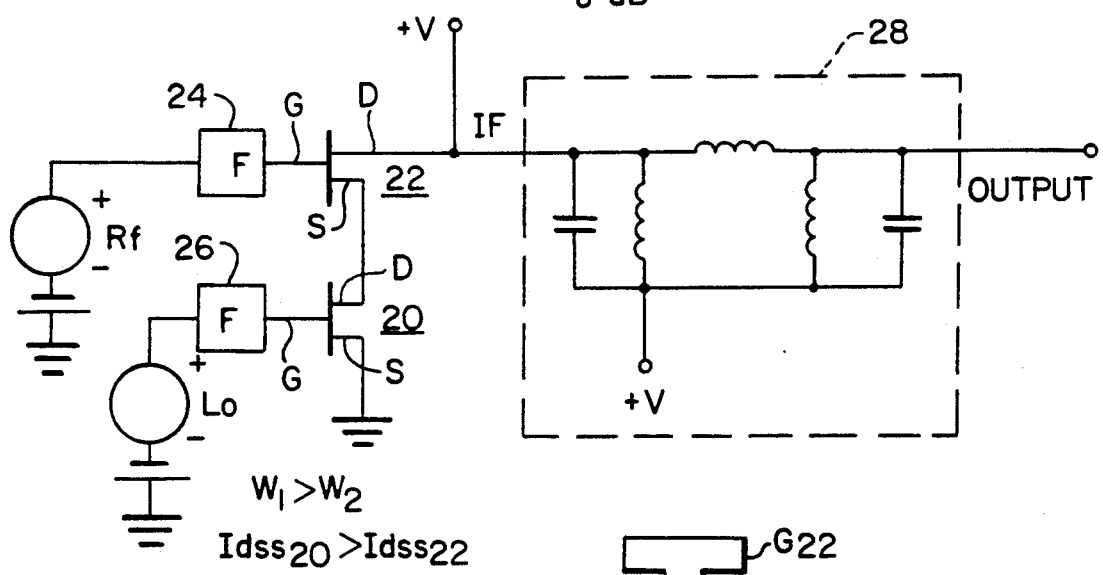
FIG. 2 is a schematic of the mixer circuit of the present invention.

With reference to FIG. 2, it can be seen that the mixer circuit of the present invention is comprised of a first field effect transistor (FET) 20 connected in series to a second FET 22. Although FETs are being used for the discussion of the present invention, it should be appreciated that bipolar transistors may be also be used. The drain of FET 20 is series connected to the source of FET 22. The source of FET 20 is grounded while the drain of FET 22 is used as the output for the present invention mixer circuit. FET 20 may be considered as the input stage while FET 22 the output stage.

Figure 3:
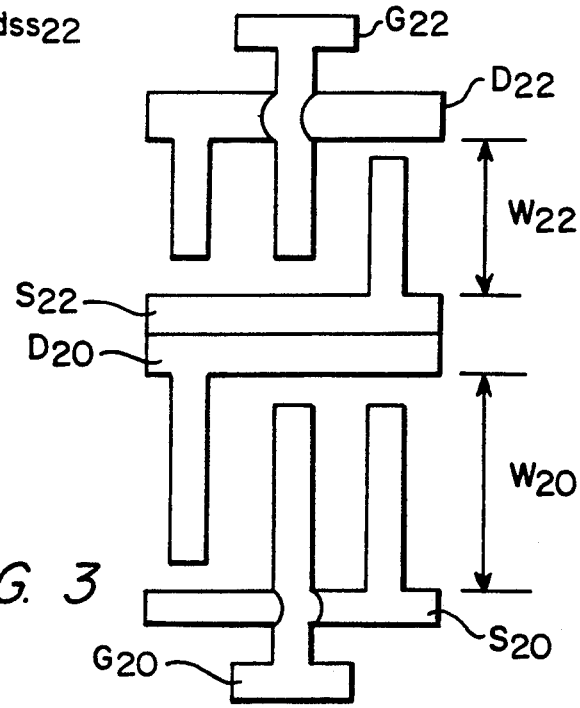
FIG. 3 is a plan view of the layout of the FETs fabricated on a semiconductor substrate for the FIG. 2 circuit.

FET 20 is capable of accepting a saturation current which is greater than what is acceptable by FET 22. In other words, the saturation current of FET 20 ($Idss_{20}$) is greater than the saturation current of FET 22 ($Idss_{22}$) to provide for a difference in saturation current between the FETs. If the FETs are fabricated onto the same semiconductor substrate, it has been found that the distance between the drain and the source regions of the input FET, i.e. FET 20, has to be greater than the distance between the drain and source regions of the output FET, i.e. FET 22. The layout for such configuration is shown in a plan view in FIG. 3, where it can be seen, with exaggeration, that the width between the drain and source regions for FET 20, as represented by $w_{20}$, is greater than that of FET 22, as represented by $w_{22}$.

The explanation for the operation and the resulting performances of such cascode dual FETs are given in the co-pending application entitled "A Modified Cascode Circuit" by the same inventor of the present invention, and incorporated herein by reference.

Returning to FIG. 2, it can seen that a RF signal is provided to the gate of FET 22 via a filter 24, while a LO signal is provided to the gate of FET 20 via filter 26. It should be appreciated that, although a RF signal is shown to be provided to FET 22 and a LO signal to FET 20, the converse situation whereby a LO signal is fed to the output stage while a RF signal is fed to the input stage of the modified cascode circuit can also happen.

As the signals are fed to the cascode circuit, they are mixed and an output signal, designated in this instance as IF, is provided at the drain of FET 22. As shown, the IF signal is fed to a filter 28, whose components are shown to be enclosed by a dotted line. Filters 24, 26 and 28 are conventional filters and the respective signals, after filtering, are shown in FIG. 4.

Figure 4:
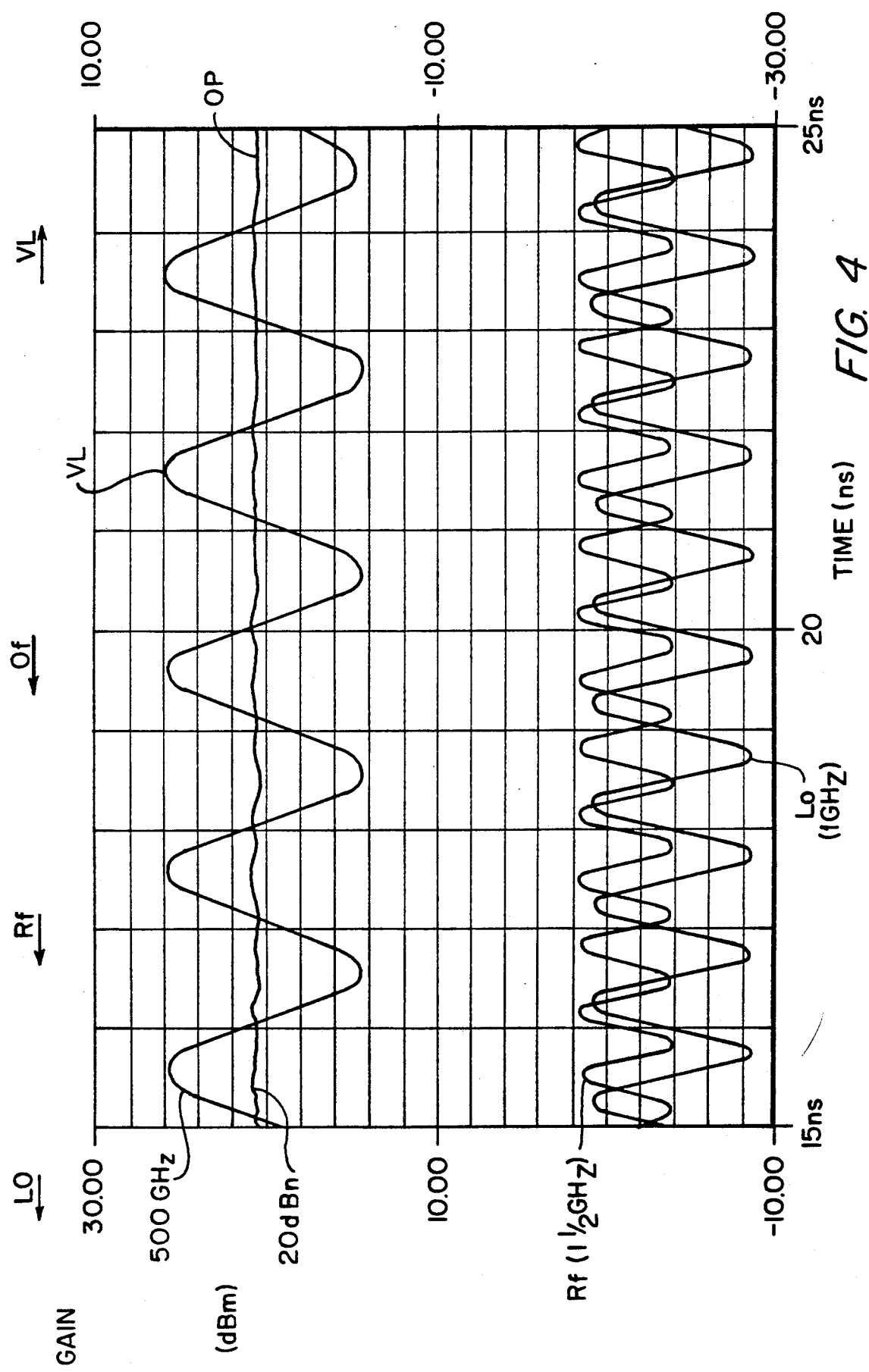
FIG. 4 is a graph showing the respective frequencies of the different signals of the FIG. 2 mixer circuit.
Figure 5:
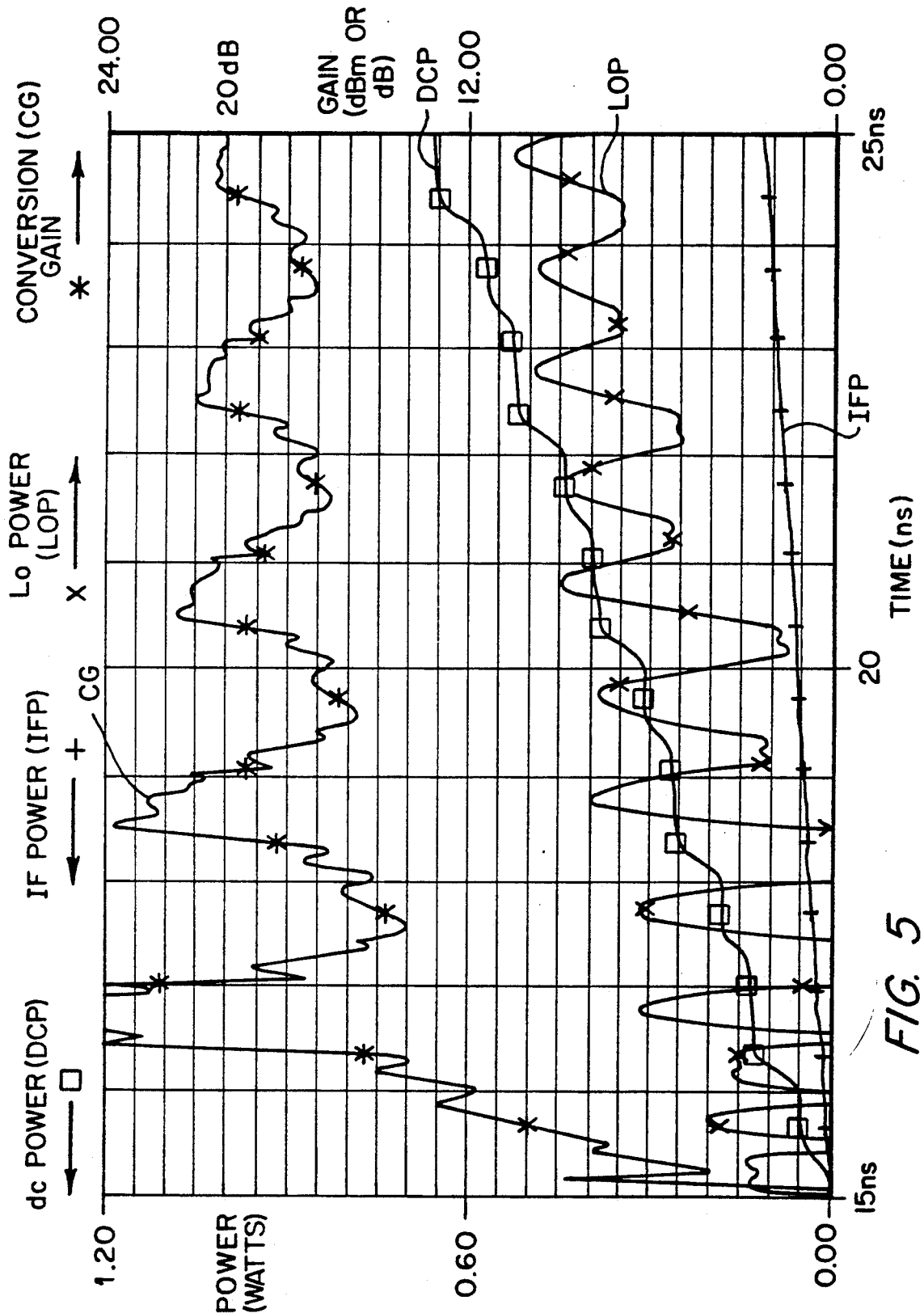
FIG. 5 is a graph illustrating the conversion gain of the output signal, and the power of the different signals being provided to the FIG. 2 mixer circuit.

Resultant waveforms for a modified cascode mixer circuit with an input stage FET having a distance between its drain and source regions of 2 millimeters (mm) and an output stage FET having a distance between its drain and source regions of 1 mm are shown in FIGS. 4 and 5.

With reference to FIG. 4, it can be seen that the input RF signal, after filtering by filter 24, is a sinusoidal signal of 1.5 GHz. Likewise, after filtering by filter 26, the LO signal is a sinusoidal waveform with a frequency of 1 GHz. The load voltage of the IF signal, after filtering by filter 28, is also shown to be a sinusoidal waveform having, in this instance, 500 GHz. The power gain of the IF signal, after filtering, is shown to be 20 dBm.

FIG. 5 shows the relationship between the input power and the output conversion gain. For example, referring to the right-most edge of FIG. 5, it can be seen that after 25 nano-seconds (nsec), with the LO power being 9.5 db, the conversion gain for the cascode circuit is 20 db. This is equivalent to the state of the art conversion gain of 19 db obtained by a prior art mixer circuit having 8 watt of input DC power.

For the mixer circuit of the present invention, however, as shown in FIG. 5, the IF power, with reference to the left-most edge of FIG. 5, is only approximately 115 mW. Likewise, the DC power, again with reference to the left-most edge, is only 0.7 W. Therefore, as is clearly shown in FIG. 5, the modified cascode mixer circuit of the present invention not only is capable of providing for a conversion gain that meets, or exceeds, the prior art high level mixers, but also has an input power which is magnitudes lower than that required for the prior art mixer circuits. For FIG. 5, it should be appreciated that the oscillations between the left-most and right-most edges of the graph is representative of numerical integration. Therefore, the useful information should only be gleaned at either the right-most or the left-most edges.

Inasmuch as the present invention is subject to many variations, modifications and changes in detail, it is intended that all matter described throughout this specification and shown in the accompanying drawings be interpreted only as illustrative and not in a limiting sense. Accordingly, it is intended that the invention be limited only by the spirit and scope of the appended claims.

I claim:

1. A mixer circuit, comprising:
   a first FET having a first signal provided as input to its gate;
   a second FET having as an input to its gate a second signal, the source of the second FET being grounded, the second FET capable of having a higher saturation current than the first FET to ensure that the first FET has high gain to provide for maximum voltage and current swings at its drain;
   wherein the first FET has its source connected to the drain of the second FET; and
   wherein the first signal is mixed with the second signal to provide an output high conversion gain signal at the drain of the first FET.

2. The mixer circuit of claim 1, wherein the first and second FETs are fabricated onto a semiconductor substrate with each FET having respective source, drain and gate regions; and
   wherein the second FET has a greater distance separating its drain and source regions on the semiconductor substrate than the first FET.

3. The mixer circuit of claim 1, wherein the first signal is a RF signal, the second signal is a local oscillator signal and the high conversion gain signal is an IF signal.

4. The mixer circuit of claim 1, wherein the first signal is a local oscillator signal, the second signal is a RF signal and the high conversion gain signal is an IF signal.

5. The mixer circuit of claim 1, further comprising:
   a first filter provided at the gate of the first FET for filtering the first signal;
   a second filter provided at the gate of the second FET for filtering the second signal; and
   a third filter provided at the drain of the first FET for filtering the output high conversion gain signal.

6. A mixer circuit comprising:
   a cascode circuit having an output stage FET series connected at its source to the drain of an input stage FET, the input stage FET having a saturation current level greater than that of the output stage FET;
   wherein a first signal is provided to the output stage FET and a second signal is provided to the input stage FET; and
   wherein the first and second signals are combined in the cascode circuit such that a high conversion gain signal is output from the mixer circuit.

7. The mixer circuit of claim 6, wherein the mixer circuit is fabricated onto a semiconductor substrate with each FET having respective source, drain and gate regions; and
   wherein the input stage FET has a distance separating its source and drain regions which is greater than the distance separating the source and drain regions of the output stage FET.

8. The mixer circuit of claim 6, further comprising:
   a first filter for filtering the first signal;
   a second filter for filtering the second signal; and
   a third filter for filtering the output high conversion gain signal.

9. The mixer circuit of claim 6, wherein the first signal is a RF signal, the second signal is a local oscillator signal and the high conversion gain signal is an IF signal.

10. The mixer circuit of claim 6, wherein the first signal is a local oscillator signal, the second signal is a RF signal and the high conversion gain signal is an IF signal.

* * * * *